(12) United States Patent
Funaki et al.

(10) Patent No.: US 6,552,535 B2
(45) Date of Patent: Apr. 22, 2003

(54) DEFECT DETECTOR CIRCUIT WITH A SIGNAL SYNTHESIZER AND MAGNET DISK CERTIFIER USING THE SAME DEFECT DETECTOR CIRCUIT

(75) Inventors: Toshiharu Funaki, Kanagawa-ken (JP); Shinji Honma, Kanagawa-ken (JP); Kenichi Shitara, Kanagawa-ken (JP); Hideki Mochiduki, Kanagawa-ken (JP)

(73) Assignee: Hitachi Electronics Engineering Co., Ltd., Tokyo (JP)

(*) Notice: Subject to any disclaimer, the term of this patent is extended or adjusted under 35 U.S.C. 154(b) by 0 days.

(21) Appl. No.: 09/962,089

(22) Filed: Sep. 26, 2001

(65) Prior Publication Data

US 2002/0041184 A1 Apr. 11, 2002

(30) Foreign Application Priority Data

Sep. 28, 2000 (JP) ........................................ 2000-296425

(51) Int. Cl.⁷ .............................................. G01R 33/12
(52) U.S. Cl. .......................................... 324/212; 360/25
(58) Field of Search ................................. 324/212, 252, 324/210, 211; 338/32 R; 360/31, 75, 25, 53, 72.1; 714/719, 819

(56) References Cited

U.S. PATENT DOCUMENTS

| | | | | |
|---|---|---|---|---|
| 5,812,560 A | * | 9/1998 | Yuki | ........................... 371/21.2 |
| 6,140,814 A | * | 10/2000 | Sundaram | ................... 324/212 |
| 6,445,519 B1 | * | 9/2002 | Weinstein et al. | ............. 360/25 |

\* cited by examiner

*Primary Examiner*—Edward Lefkowitz
*Assistant Examiner*—Subhash Zaveri
(74) *Attorney, Agent, or Firm*—Mattingly, Stanger & Malur, P.C.

(57) ABSTRACT

A magnetic disk certifier includes a defect detector circuit comprising a low-pass filter for extracting a low frequency component of the read-out signal, the low frequency component containing a signal component of the error, a signal generator circuit for generating a signal having a predetermined frequency lower than the frequency of the read-out signal, a synthesizer circuit for synthesizing an output signal of the low-pass filter and the signal outputted from the signal generator circuit and a comparator for generating an error signal by comparing the synthesized signal from the synthesizer circuit with a predetermined reference level.

12 Claims, 2 Drawing Sheets

DEFECT DETECTOR CIRCUIT WITH A SIGNAL SYNTHESIZER AND MAGNET DISK CERTIFIER USING THE SAME DEFECT DETECTOR CIRCUIT

BACKGROUND OF THE INVENTION

1. Field of the Invention

The present invention relates to a defect detector circuit and a magnetic disk certifier using the same defect detector circuit and, particularly, the present invention relates to an improvement of a magnetic disk certifier for testing a magnetic disk memory medium on error of electric characteristics thereof, such as missing error, spike error and/or thermal asperity error, to make the magnetic disk certifier possible to perform a defect test of the magnetic disk written with test data at high write frequency by using low frequency suitable for the defect detection.

2. Description of the Related Art

When a magnetic disk such as hard magnetic disk for recording an information is defective, a problem occurs in a recording performance of the hard magnetic disk. Therefore, the quality of the hard magnetic disk is evaluated or certified by performing a test on whether or not the magnetic disk has any electric defect of the disk and, if any, on the degree of the defect by a magnetic disk certifier.

In a conventional magnetic disk certifier, a test data having a predetermined code, for example, FFh, is generated according to a test signal having frequency $f_0$ generated by a test signal generator circuit, is converted into a write current having a predetermined level by a write/read amplifier and is written in respective tracks of the magnetic disk sequentially through a magnetic head. Incidentally, "h" of FFh indicates hexadecimal notation and FF indicates data having bits all of which are "1".

When the write of the test data with respect to all of the tracks of the magnetic disk is completed, the written test data is read out sequentially as a positive phase read-out signal and a negative phase read-out signal by a magnetic head through a write/read amplifier and inputted to a level regulation amplifier. The two read-out signals having levels regulated by the level regulation amplifier are inputted to a slice level setting circuit and a defect detector circuit. In the slice setting circuit, a predetermined slice level for the read-out signals are generated and the slice level is inputted to the defect detector circuit. Incidentally, when the signal code of the test data is FFh, the frequency of each read-out signal becomes a half of a frequency $f_0$ of the test data. In the defect detector circuit, defect detection is performed correspondingly to the slice level set by the slice level setting circuit.

Incidentally, the read-out signals have positive peaks and negative peaks with respect to a predetermined reference amplitude level, respectively.

With the recent increase of memory capacity of magnetic disk, the test frequency of a magnetic disk certifier, that is, the frequency of a test signal, is increased up to several hundreds MHz or higher. Therefore, it is necessary to use a processing circuit having high performance corresponding to such high frequency test signal as a defect detector circuit. In such case, the higher the test signal frequency is the more severe the defect detector circuit times a setting period required to detect a defect. Therefore, possibility of erroneous detection may become high. On the other hand, it is usual that such defect detector circuit is designed as a LSI circuit. However, the current circuit design for preventing erroneous detection when such high test frequency is used is not always satisfactory.

In order to solve these problems of the conventional magnetic disk certifier, U.S. Pat. No. 5,812,560, which is assigned to the assignee of the present application, discloses a technique, in which an error detection from a read-out signal is performed with using a thinned timing so that a defect detector circuit similar to the conventional magnetic disk certifier can be used by thinning the detection number of defects.

Since, in such thinning process, however, the error detection timing, that is, the bit period of the test data, is limited to a value which is one n-th the bit period of the test data to be detected, where n is an integer, there may a case where a defect can not be detected by selecting a suitable frequency.

SUMMARY OF THE INVENTION

An object of the present invention is to provide a defect detector circuit capable of detecting defect of a magnetic disk written with a test data at high frequency by using low frequency suitable for a defect detection.

Another object of the present invention is to provide a magnetic disk certifier capable of detecting defect of a magnetic disk written with a test data at high frequency by using low frequency suitable for a defect detection.

In order to achieve these objects, a defect detector circuit and a magnetic disk certifier for detecting an error of a magnetic disk on a basis of a read-out signal, which is acquired by writing a predetermined test data in a magnetic disk according to a test signal having specific frequency and reading the test data as having a frequency related to the frequency of the test signal, are featured by comprising a low pass filter for deriving a low frequency component containing a signal component of an error mainly from the read-out signal, a signal generator circuit for generating a signal having a predetermined frequency lower than the frequency of the read-out signal, a synthesizer circuit for synthesizing the signal outputted from the low pass filter with the signal outputted from the signal generator circuit and a comparator for comparing a synthesized signal outputted from the synthesizer circuit with a predetermined level to generate an error signal.

It has been known that, when defect of a magnetic disk is considered in bit unit of the test signal, the higher the recording density of the magnetic disk is the smaller the detection unit of defect of the magnetic disk. The size of defect, which is detectable by using one bit, is increased to some extent correspondingly to an increase of the recording density. Therefore, defect is usually detected as a plurality of bit defects when the recording density becomes high.

In other words, a defect detected by every write bit when a test data is written at high density is usually not one bit but a plurality of successive bits. In the defect detector circuit and the magnetic disk certifier according to the present invention having the above mentioned construction, the error frequency component, which is low, of the read signal and the basic frequency component thereof, which is high, are separated from each other. The high frequency of the basic frequency component thus separated is converted to a component having a lower frequency and synthesized with the error frequency component to generate a pseudo read signal. The defect detection is performed by this pseudo read signal having low frequency. The low frequency, which can be selected, is not limited to one n-th where n is an integer, contrarily to the case where the defect detection is performed by the thinning process of the error detection timing. According to the present invention, it is possible to select an optimal frequency in concord with the accuracy of defect detection.

As a result, the error detection of a disk tested at high frequency becomes possible at low frequency, so that the defect detection circuit, the setting of the detection timing of which is not severe and which hardly produces erroneous detection, is easily realized. Further, it is possible to realize the magnetic disk certifier having high reliability, which is not substantially lowered even when the defect detection is performed by using lower frequency than the test signal frequency.

DETAILED DESCRIPTION OF THE PREFERRED EMBODIMENTS

Figure 1:
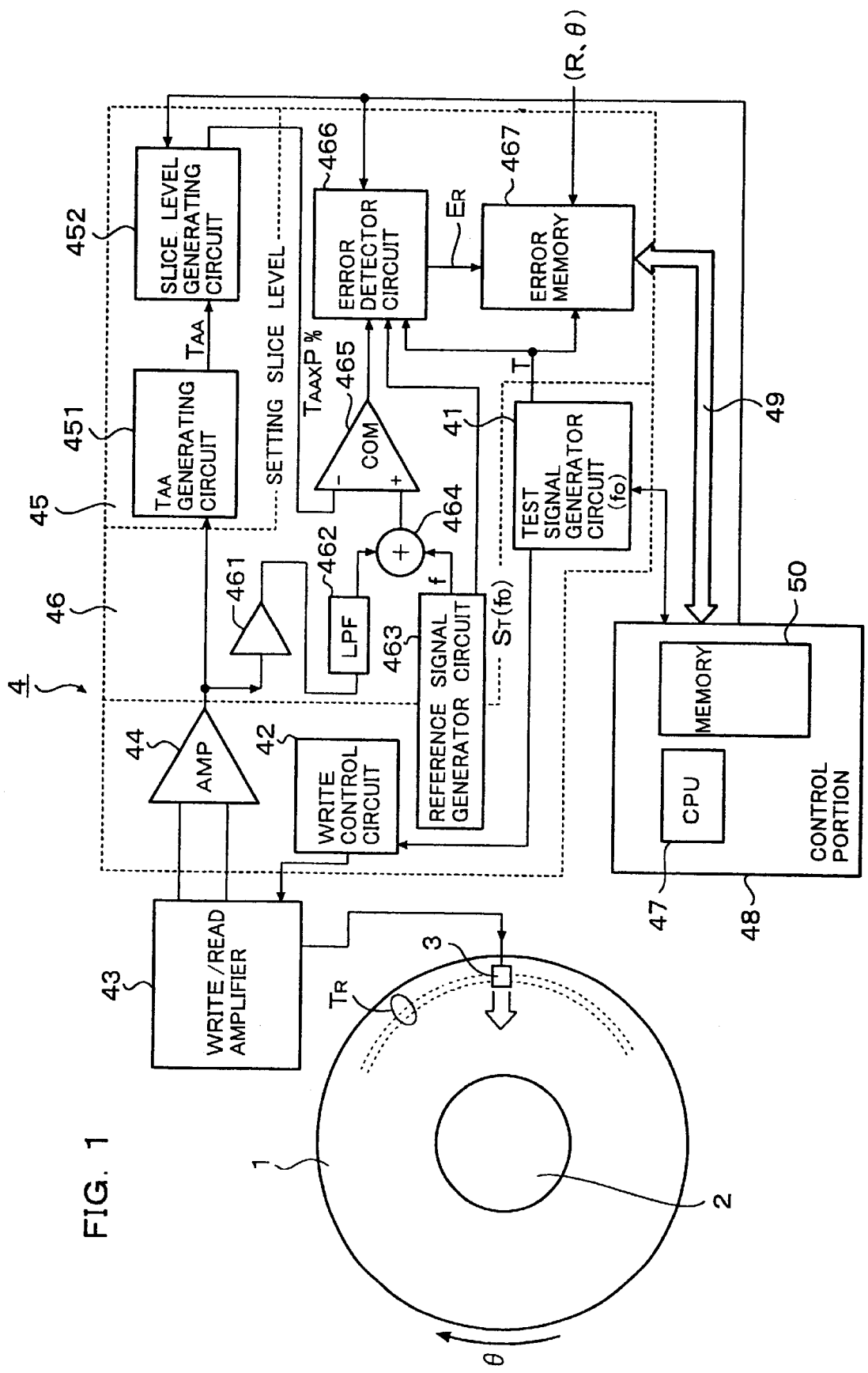
FIG. 1 is a block diagram of a magnetic disk certifier including a defect detector circuit according to an embodiment of the present invention.

In FIG. 1 showing a block diagram of a magnetic disk certifier including a defect detector circuit according to an embodiment of the present invention, a magnetic disk 1 to be tested is mounted on a spindle 2 and rotated thereby. On the other hand, a test signal $S_T$ having frequency $f_0$, for example, 600 MHz, is generated by a test signal generator circuit 41 of a defect testing circuit 4 and supplied to a write control circuit 42. Test data corresponding to the test signal $S_T$ is generated by the write control circuit 42 and supplied to a write/read amplifier 43 in which the test data is converted into a write current having a predetermined level. The test data is written in respective tracks $T_R$ of the magnetic disk 1 sequentially by a magnetic head 3.

When the write of the test data to all of the tracks TR on the magnetic disk 1 is completed, the test data thus written is read out sequentially by the magnetic head 3 as a positive phase read signal and a negative phase read signal through the write/read amplifier 43 and supplied to a level regulating amplifier (AMP) 44. In the level regulating amplifier 44, the level of the read signals is regulated and inputted to a slice level setting circuit 45 and a defect detector circuit 46. Incidentally, when the format of test data is FFh, the frequency of the read-out signal becomes 300 MHz, which is a half of the frequency $f_0$ of the test signal $S_T$.

The slice level setting circuit 45 is constructed with a track average amplitude generating circuit (referred to as "$T_{AA}$ generating circuit", hereinafter) 451 for generating an average value of one track and a slice level generating circuit 452. The $T_{AA}$ generating circuit 451 is constructed with, for example, an envelope detector circuit, a one-track integration circuit and a peak detection circuit, etc., which are not shown. An output voltage value of the $T_{AA}$ generating circuit 451 is supplied to the slice level generator circuit 452. The slice level generator circuit 452 generates a voltage value, which is a predetermined percentage of the level of the output voltage of the $T_{AA}$ generator circuit 451, as a threshold level, that is, a slice level. The predetermined percentage is set by a signal P, which is supplied from a CPU 47 of a control portion 48. The slice level thus generated by the slice level generator circuit 452 is supplied to a comparator 465 of the defect detector circuit 46. Depicting the voltage value of the output signal of the $T_{AA}$ generator circuit 451 by $T_{AA}$, the slice level signal is a voltage signal having an amplitude of $T_{AA} \times P$ (%).

Incidentally, various programs to be used to test a magnetic disk are stored in a memory 50 of the control portion 48.

The defect detector circuit 46 is composed of an envelope signal generator circuit 461, a low-pass filter (LPF) 462, a reference signal generator circuit 463, a synthesizer circuit 464, a comparator 465, an error detector circuit 466 and an error memory 467.

The envelope signal generator circuit 461 generates an envelope signal of one of the positive side read-out signal and the negative side read-out signal, which are output of the level regulating amplifier 44. The envelope signal generator circuit 461 is constructed with a so-called envelope detector circuit or a peak follower circuit. An output signal of the envelope signal generator circuit 461 is a low frequency signal containing error components such as modulation error and thermal asperity (TA) error, etc., mainly and is supplied to the LPF 462 as the envelope signal. The error components of the output signal of the envelope detector circuit 461 are extracted by the LPF 462 and unnecessary high frequency noise components thereof are removed thereby. The envelope signal from the LPF 462 is supplied to the synthesizer circuit 464.

On the other hand, the synthesizer circuit 464 is supplied with a reference signal having frequency f ($f < f_0/2$), for example, 200 MHz, from the reference signal generator circuit 463. The synthesizer circuit 464 is an add circuit adding the envelope signal to the reference signal. Therefore, the synthesizer circuit 464 generates a signal, which is made by adding the envelope signal to the reference signal. Thus, the read-out signal having frequency $f_0/2$ (=300 MHz) is converted into a pseudo read-out signal having a frequency f (=200 MHz) lower than the frequency of the read-out signal.

The pseudo read-out signal thus obtained is supplied to the comparator 465 and compared with the predetermined slice level ($T_{AA} \times P(\%)$) to detect an initial error. An error signal detected by the comparator 465 is supplied to the error detector circuit 466.

The error detector circuit 466 is constructed with a gate circuit. In the missing test, for example, the error detector circuit 466 receives the detection signal from the comparator 465, a clock signal CLK from the reference signal generator circuit 463 as a timing signal. The error detector circuit 466 generates a window pulse signal having pulse width of a predetermined setting period, for example, 1.5 t±α, where t is a period of each bit of the test data and α is a tolerable range of a shift of peak, according to the timing signal T and outputs a bit error signal $E_R$ in synchronism with respective bits of the timing signal T when there is no output from the comparator 465 in the period of the window pulse signal.

On the other hand, in a case of the spike error test and when there is a detection output from the comparator 465 in the predetermined setting period 1.5 t±α, the error detector circuit 466 outputs the bit error signal $E_R$. Incidentally, a switching between the missing test and the spike error test is performed by a control signal supplied from the CPU 47 to the error detector circuit 466.

Further, in a case of the modulation error test or the thermal asperity error test, the detection output of the comparator 465 is outputted as an error detection signal.

The detection output (error bit signal) of the error detector circuit 466 is sequentially recorded in predetermined addresses of the error memory 467, which are accessed according to the generation timing of the detection output, together with coordinates (R, θ) of scan position (detection position) on the magnetic disk from which the error bits are obtained.

Incidentally, the detection position coordinates (R, θ) is obtained from an amount of rotation of the spindle 2 and a rotation reference position thereof detected by a rotary encoder (not shown) and an access position of the magnetic head 3 in a radial direction R of the magnetic disk 1 and is supplied from the control portion 48 or other circuit dedicated thereto. Write address of the error memory 467 is updated according to the detection output of the error detector circuit 466 and the error memory 467 stores error bits and detection position thereof in synchronism with the timing signal T from the test signal generator circuit 41 only when error occurs.

Figure 2:
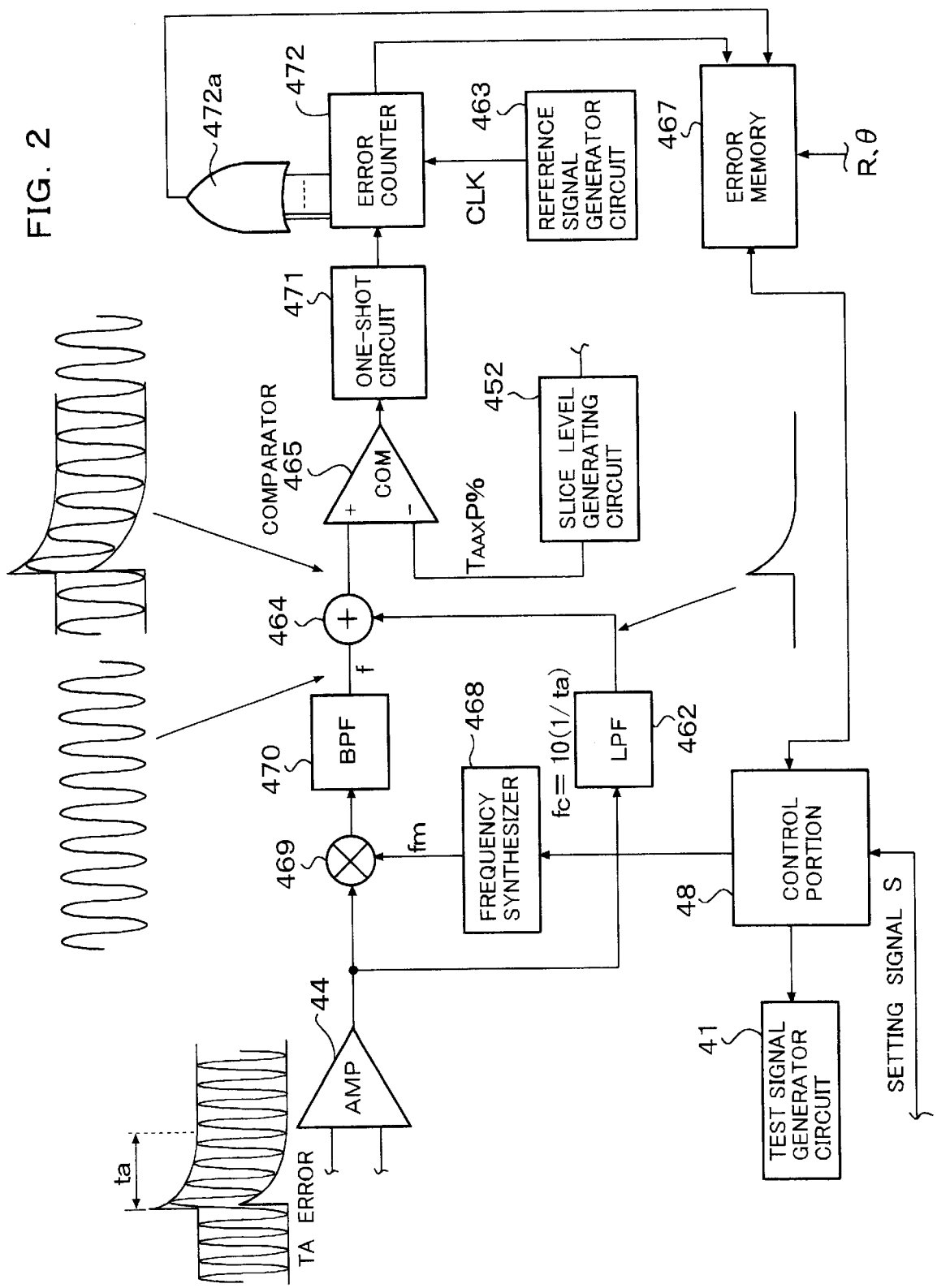
FIG. 2 is a block diagram of a magnetic disk certifier including a defect detector circuit according to another embodiment of the present invention.

FIG. 2 is a block diagram of a magnetic disk certifier including a defect detector circuit according to another embodiment of the present invention. In FIG. 2, the same components as those in FIG. 1 are depicted by the same reference numerals, respectively.

The embodiment shown in FIG. 2 comprises, in addition to the test signal generator circuit 41, the level regulating amplifier 44, the control portion 48, the slice generating circuit 452, the LPF 462, the reference signal generator circuit 463, the synthesizer circuit 464, the comparator 465 and the error memory 467, which are included in the embodiment shown in FIG. 1, a frequency synthesizer 468 for externally setting a frequency fm generated thereby, a frequency mixer 469, a band pass filter (BPF) 470, a one-shot circuit 471 and an error counter 472 including an OR circuit 472a. Assuming that the frequency fm generated by the frequency synthesizer 468 is externally set to 600 MHz and the test signal $S_T$ having frequency $f_0$ of 800 MHz is supplied to the write control circuit 42, the read-out signal having frequency $f_0/2$, which is, for example, 400 MHz, and supplied from the level regulating amplifier 44 is mixed with a signal having 600 MHz from the frequency synthesizer 468 by the frequency mixer 469 to obtain an arbitrary low frequency f, for example, 200 MHz.

In this embodiment, the one-shot circuit 471 and the error counter 472 are provided in lieu of the error detector circuit 466 shown in FIG. 1 and the one-shot circuit 471 receives the output of the comparator 465. Further, in this embodiment, the envelope signal generator circuit 461 shown in FIG. 1 is removed and the read-out signal having frequency $f_0/2$ (=400 MHz) is directly supplied to the LPF 462 and then to the synthesizer circuit 464. The output of the frequency mixer 469, that is, the signal having low frequency f (=200 MHz) is passed through the narrow band-pass filter (BPF) 470 having center frequency of 200 MHz to extract a frequency converted fundamental frequency component of the read-out signal. The frequency converted fundamental frequency component is supplied to the synthesizer circuit 464.

The output of the comparator 465, which compares the output signal of the synthesizer circuit 464 with the slice level, is supplied to the one-shot circuit 471 and waveform-shaped to pulses having a constant width. The pulses are counted by the error counter 472 and the count value is supplied to the error memory 467.

The error counter 472 counts the number of output pulses of the one-shot circuit 471 during a period of the reference signal from the reference signal generator circuit 463, which, in this embodiment, generates a clock signal CLK of 50 MHz, which is lower than 200 Mz of the center frequency of the band-pass filter (BPF) 470 and even lower than the frequency of the output of the reference signal generator circuit 463. Incidentally, the error memory 467 receives the outputs of respective digits of the error counter 472 through the OR gate 472a and the write address thereof is updated in synchronism with the clock CLK of the reference signal generator circuit 463. Therefore, when the count value of the error counter 472 is 1 or more, the count value data is written in the error memory together with coordinates (R, θ) thereof on the magnetic disk.

Since it is possible to further reduce the write frequency of the defect data in the error memory 467, it is possible to restrict the capacity of the error memory 467 even if the number of defects becomes large.

Incidentally, signal waveforms at the respective portions of the magnetic disk certifier shown in FIG. 2 are those in a case where the defect to be tested is the thermal asperity error (TA).

In the embodiment shown in FIG. 2, the center frequency of the BPF 470 is 200 MHz constantly. The frequency of the frequency synthesizer 468 is set by the control portion 48 according to the frequency $f_0/2$ of the read-out signal. The control portion 48 sets the frequency of the test signal generator circuit 41 according to a setting signal S supplied externally for setting the write test frequency $f_0$ and sets the output frequency of the frequency synthesizer 468 to either ($f_0/2+200$ MHz) or ($f_0/2-200$ MHz) such that the signal frequency obtained from the frequency mixer becomes 200 MHz. Incidentally, the test signal generator circuit 41 includes a programmable oscillator whose oscillation frequency is externally settable.

Since an operation of the whole defect detector circuit shown in FIG. 2 is similar to that of the detect detector shown in FIG. 1, a description thereof is omitted for avoidance of duplication.

Although, in the embodiment shown in FIG. 2, the read-out signal is directly supplied to the LPF 462, it may be possible to indirectly supply the read-out signal to the LPF 462 through the envelope signal generator circuit 461 as in the embodiment shown in FIG. 1.

Further, although the embodiment shown in FIG. 2 has been described with reference to the read-out signal of the test signal $S_T$ having frequency $f_0$ when the signal format of the test data is FFh, the fundamental frequency is substantially equal to that in the FFh format or a frequency determined correspondingly to the frequency of the test signal $S_T$, even when other test data is written in tracks of a magnetic disk.

Further, the comparator 465 in the embodiment shown in FIG. 2 may be replaced by a pair of comparators provided for the positive side read-out signal and the negative side read-out signal, respectively. In the latter case, the positive side read-out signal and the negative side read-out signal are obtained by the level regulating amplifier 44. The two comparators are operated to compare waveforms of the positive side read-out signal and the negative side read-out signal, respectively.

What is claimed is:

1. A defect detector circuit for writing a predetermined test data on a magnetic disk according to a test signal having a predetermined frequency and detecting an error on a basis of a read-out signal having a frequency following the frequency of the test signal and obtained by reading out the test data from said magnetic disk, comprising:

a low-pass filter for extracting a low frequency component of the read-out signal, the low frequency component containing a signal component of the error;

a signal generator circuit for generating a signal having a predetermined frequency lower than the frequency of the read-out signal;

a synthesizer circuit for synthesizing an output signal of said low-pass filter and the signal outputted from said signal generator circuit; and a comparator for generating an error signal by comparing a synthesized signal from said synthesizer circuit with a predetermined reference level.

2. A defect detector circuit as claimed in claim 1, wherein the read-out signal has a positive peak and a negative peak with reference to a predetermined amplitude reference level, said defect detector circuit further comprising an envelope signal generator circuit for generating an envelope signal of either the positive peak of the read-out signal or the negative peak thereof, wherein said signal generator circuit generates a signal having a constant frequency and said low-pass filter receives the signal from said envelope signal generator circuit and sends an output of said low-pass filter to said synthesizer circuit.

3. A defect detector circuit as claimed in claim 1, wherein the synthesizer circuit is an add circuit adding the output signal of said low-pass filter to the output signal of said signal generator circuit.

4. A defect detector circuit as claimed in claim 3, further comprising an error detector circuit responsive to the error signal outputted by said comparator and the output signal of said signal generator circuit for generating a bit signal indicative of the error in synchronism with the output signal of said signal generator circuit and an error memory for storing the bit signal together with a position coordinates of said magnetic disk.

5. A defect detector circuit as claimed in claim 1, wherein said signal generator circuit comprises a frequency synthesizer for generating an externally controllable frequency, a frequency mixer circuit and a band-pass filter having a center frequency corresponding to a predetermined frequency lower than the frequency of the read-out signal, wherein said frequency mixer circuit receives an output signal of said frequency synthesizer and the read-out signal and frequency-converts the frequency of the read-out signal into a frequency substantially equal to the center frequency of said band-pass filter, the frequency-converted read-out signal being supplied to said synthesizer circuit through said band-pass filter.

6. A defect detector circuit as claimed in claim 5, further comprising a reference signal generator circuit for generating a clock signal having frequency lower than the center frequency of said band-pass filter, a one-shot circuit supplied with the output signal of said comparator, a counter for counting outputs of said one-shot circuit in a period of the clock signal and an error memory for storing the count value of said counter together with a coordinates of a position of said magnetic disk in synchronism with the clock signal.

7. A magnetic disk certifier for writing a predetermined test data on a magnetic disk according to a test signal having a predetermined frequency and detecting an error on a basis of a read-out signal having a frequency following the frequency of the test signal and obtained by reading out the test data from said magnetic disk, comprising:

a low-pass filter for extracting a low frequency component of the read-out signal, the low frequency component containing a signal component of the error;

a signal generator circuit for generating a signal having a predetermined frequency lower than the frequency of the read-out signal;

a synthesizer circuit for synthesizing an output signal of said low-pass filter and the signal outputted from said signal generator circuit; and a comparator for generating an error signal by comparing a synthesized signal from said synthesizer circuit with a predetermined reference level.

8. A magnetic disk certifier as claimed in claim 7, wherein the read-out signal has a positive peak and a negative peak with reference to a predetermined amplitude reference level, said magnetic disk certifier further comprising an envelope signal generator circuit for generating an envelope signal of either the positive peak of the read-out signal or the negative peak thereof, wherein said signal generator circuit generates a signal having a constant frequency and said low-pass filter receives the signal from said envelope signal generator circuit and sends an output of said low-pass filter to said synthesizer circuit.

9. A magnetic disk certifier as claimed in claim 7, wherein the synthesizer circuit is an add circuit adding the output signal of said low-pass filter to the output signal of said signal generator circuit.

10. A magnetic disk certifier as claimed in claim 9, further comprising an error detector circuit responsive to the error signal outputted by said comparator and the output signal of said signal generator circuit for generating a bit signal indicative of the error in synchronism with the output signal of said signal generator circuit and an error memory for storing the bit signal together with a position coordinates of said magnetic disk.

11. A magnetic disk certifier as claimed in claim 7, wherein said signal generator circuit comprises a frequency synthesizer for generating an externally controllable frequency, a frequency mixer circuit and a band-pass filter having a center frequency corresponding to a predetermined frequency lower than the frequency of the read-out signal, wherein said frequency mixer circuit receives an output signal of said frequency synthesizer and the read-out signal and frequency-converts the frequency of the read-out signal into a frequency substantially equal to the center frequency of said band-pass filter, the frequency-converted read-out signal being supplied to said synthesizer circuit through said band-pass filter.

12. A magnetic disk certifier as claimed in claim 11, further comprising a reference signal generator circuit for generating a clock signal having frequency lower than the center frequency of said band-pass filter, a one-shot circuit supplied with the output signal of said comparator, a counter for counting outputs of said one-shot circuit in a period of the clock signal and an error memory for storing the count value of said counter together with a coordinates of a position of said magnetic disk in synchronism with the clock signal.

* * * * *